United States Patent
Wang et al.

(10) Patent No.: US 10,416,242 B2
(45) Date of Patent: Sep. 17, 2019

(54) HIGH VOLTAGE CIRCUITRY WITH DRIFT MITIGATION

(71) Applicant: InvenSense, Inc., San Jose, CA (US)

(72) Inventors: Stanley Bo-Ting Wang, Cupertino, CA (US); Nikhil Acharya, Mountain View, CA (US); Pruthvi Chaudhari, Redwood City, CA (US)

(73) Assignee: InvenSense, Inc., San Jose, CA (US)

( * ) Notice: Subject to any disclaimer, the term of this patent is extended or adjusted under 35 U.S.C. 154(b) by 92 days.

(21) Appl. No.: 15/699,773

(22) Filed: Sep. 8, 2017

(65) Prior Publication Data

US 2019/0079137 A1    Mar. 14, 2019

(51) Int. Cl.
| | |
|---|---|
| G05F 1/10 | (2006.01) |
| G05F 3/02 | (2006.01) |
| G01R 31/396 | (2019.01) |
| G01R 31/28 | (2006.01) |
| G01R 19/10 | (2006.01) |
| G11C 5/14 | (2006.01) |
| G01R 31/3835 | (2019.01) |

(52) U.S. Cl.
CPC ........... *G01R 31/396* (2019.01); *G01R 19/10* (2013.01); *G01R 31/2879* (2013.01); *G01R 31/3835* (2019.01); *G11C 5/145* (2013.01)

(58) Field of Classification Search
CPC .. H02M 3/073; H02M 3/07; H02M 2003/077; G11C 5/145; G05F 3/205
USPC .......................................................... 327/536
See application file for complete search history.

(56) References Cited

U.S. PATENT DOCUMENTS

| | | | | | |
|---|---|---|---|---|---|
| 4,263,518 | A * | 4/1981 | Ballatore | ............ | H01L 29/8605 257/260 |
| 5,569,951 | A * | 10/1996 | Grace | .................... | G01R 1/203 257/504 |
| 7,642,844 | B2 * | 1/2010 | Okuda | ................ | H01L 27/0682 257/299 |
| 9,356,506 | B1 * | 5/2016 | Ho | .......................... | H02M 3/07 |
| 2001/0030364 | A1 * | 10/2001 | Katou | ..................... | H02M 3/07 257/756 |
| 2005/0258891 | A1 * | 11/2005 | Ito | .......................... | H02M 1/32 327/538 |
| 2013/0038385 | A1 * | 2/2013 | Kodera | ............... | H01L 27/0802 327/540 |
| 2013/0200943 | A1 * | 8/2013 | Vilas Boas | ............. | H02M 3/07 327/536 |
| 2016/0226377 | A1 * | 8/2016 | Takeshita | ................ | H02M 3/07 |

* cited by examiner

*Primary Examiner* — Anh Q Tra (57) ABSTRACT

A device includes a plurality of high voltage cells (HVC) coupled to a plurality of resistors, and a controller. The plurality of HVC generates an output voltage that is higher than an input voltage to the plurality of HVC. The controller receives a reference voltage and an output voltage from a resistor of the plurality of resistors. The controller generates a signal responsive to a difference between the reference voltage and the output voltage. The controller forms a closed feedback loop with the plurality of HVC and the plurality of resistors. The generated signal is input to the plurality of HVC. A substrate of a resistor of the plurality of resistors is biased to an output of at least one high voltage cell of the plurality of HVC. Output of the at least one high voltage cell is input to another high voltage cell.

22 Claims, 6 Drawing Sheets

HIGH VOLTAGE CIRCUITRY WITH DRIFT MITIGATION

BACKGROUND

Many electronic devices utilize high voltage circuitry for various purposes. For example, in a micro-electro mechanical system (MEMS) gyroscope a high voltage may be desired to achieve reasonable sensitivity. Stability of the output voltage from the high voltage circuitry may be crucial to achieving stability in gyroscope sensitivity over time.

SUMMARY

Accordingly, a need has arisen to achieve stability in high voltage applications, e.g., MEMS gyroscope. In other words, a need has arisen to mitigate drift over time in high voltage applications in order to maintain stability and sensitivity in various applications such as MEMS gyroscopes. In some embodiments, a circuitry is provided to mitigate long term bias drift that occurs over time.

In some embodiments, an apparatus includes a plurality of high voltage cells, a plurality of resistors, and a controller. The plurality of high voltage cells is configured to generate an output voltage that is higher than an input voltage to the plurality of high voltage cells. The plurality of resistors is coupled to the plurality of high voltage cells. The controller is configured to receive a reference voltage and an output voltage from a final stage resistor of the plurality of resistors. The controller is configured to generate a signal responsive to a difference between the reference voltage and the output voltage from the final stage resistor. The controller forms a closed feedback loop with the plurality of high voltage cells and the plurality of resistors. The generated signal is input to the plurality of high voltage cells. A substrate of a resistor of the plurality of resistors is biased to an output of at least one high voltage cell of the plurality of voltage cells. An output of the at least one high voltage cell is input to another high voltage cell of the plurality of high voltage cells.

In some embodiments, a high voltage cell may include a voltage multiplier. It is appreciated that in some embodiments the resistor of the plurality of resistors that is biased to the output of the least one high voltage cell of the plurality of high voltage cells is a polysilicon resistor.

It is appreciated that in some embodiments high voltage cells of the plurality of high voltage cells are arranged in series. Moreover, in some embodiments resistors of the plurality of resistors are arranged in series.

According to some embodiments each high voltage cell of the plurality of high voltage cells is configured to generate a high voltage cell output voltage that is higher than its input voltage. In some embodiments, a substrate of each resistor of the plurality of resistors is biased to an output of a high voltage cell of the plurality of voltage cells.

It is appreciated that in one embodiment, the controller may include an error amplifier to generate the difference between the reference voltage and the output voltage from the final stage resistor. The controller may further include a clock adjustment circuitry configured to receive the generated signal from the error amplifier. The clock adjustment circuitry may be configured to adjust a clock frequency associated with the plurality of high voltage cells while maintaining a constant input voltage to a first high voltage cell of the plurality of high voltage cells. It is appreciated that the clock adjustment circuitry may further be configured to adjust an input voltage to the first high voltage cell of the plurality of high voltage cells while maintaining a constant clock frequency for the plurality of high voltage cells.

These and other features and aspects of the concepts described herein may be better understood with reference to the following drawings, description, and appended claims.

DETAILED DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Many electronic devices utilize high voltage circuitry for various purposes. For example, in a micro-electro mechanical system (MEMS) gyroscope a high voltage may be desired to achieve reasonable sensitivity. Stability of the output voltage from the high voltage circuitry may be crucial to achieving stability in gyroscope sensitivity over time. Unfortunately, resistors near the output of high voltage cells have high voltage stress between resistor and the metal layer as well as between the resistor and the substrate. The high voltage stress causes charge trapping over time in the dielectric, resulting in charge depletion in the resistor and increase of resistance which impacts the high voltage circuit output, and also the sensitivity and accuracy of the electronic device. More specifically in applications using closed loop high voltage cells, voltage difference between the resistor and its substrate and/or metal layer results in a high voltage stress leading to charge depletion. Thus, the resistance drifts over time resulting in deterioration of the sensitivity and/or the performance. It is appreciated that charge trapping may have a high correlation with voltage across resistor to its substrate or metal above the resistor.

Accordingly, a need has arisen to achieve stability in high voltage applications, e.g., MEMS gyroscope. In other words, a need has arisen to mitigate drift over time in high voltage applications in order to maintain stability and sensitivity in various applications such as MEMS gyroscope. In some embodiments, a circuitry is provided to mitigate long term bias drift that occurs over time.

In some embodiments, a plurality of high voltage cells may be used where the output voltage for each cell is higher than its input voltage. The output voltage of the last high voltage cell may be coupled to an amplifier through a plurality of resistors. The amplifier compares the output voltage to the reference voltage, which is constant, and based on the comparison sends a signal to a clock adjustment circuitry to adjust the clocking signal of the high voltage cells in order to control the output voltage. In other words, a feedback loop is formed.

The output voltage of the last high voltage cell is high, thereby causing high voltage stress between the resistors and the substrate as well as the high voltage stress between the resistors and the metal layer causing increases in resistance. Depletion of resistance is much more severe for resistances closer to the output of the last high voltage cell in comparison to the remainder of the resistances, causing the resistance ratio to change and the output voltage of the last high voltage cell to drift. In order to address the change in resistance ratio and increases in the resistance that causes the output voltage to drift, the substrate of the resistors (e.g., resistors closer to the output of the last high voltage cell) may be biased at a voltage close to the output voltage of the last high voltage cell, thereby reducing the voltage stress.

Figure 1A:
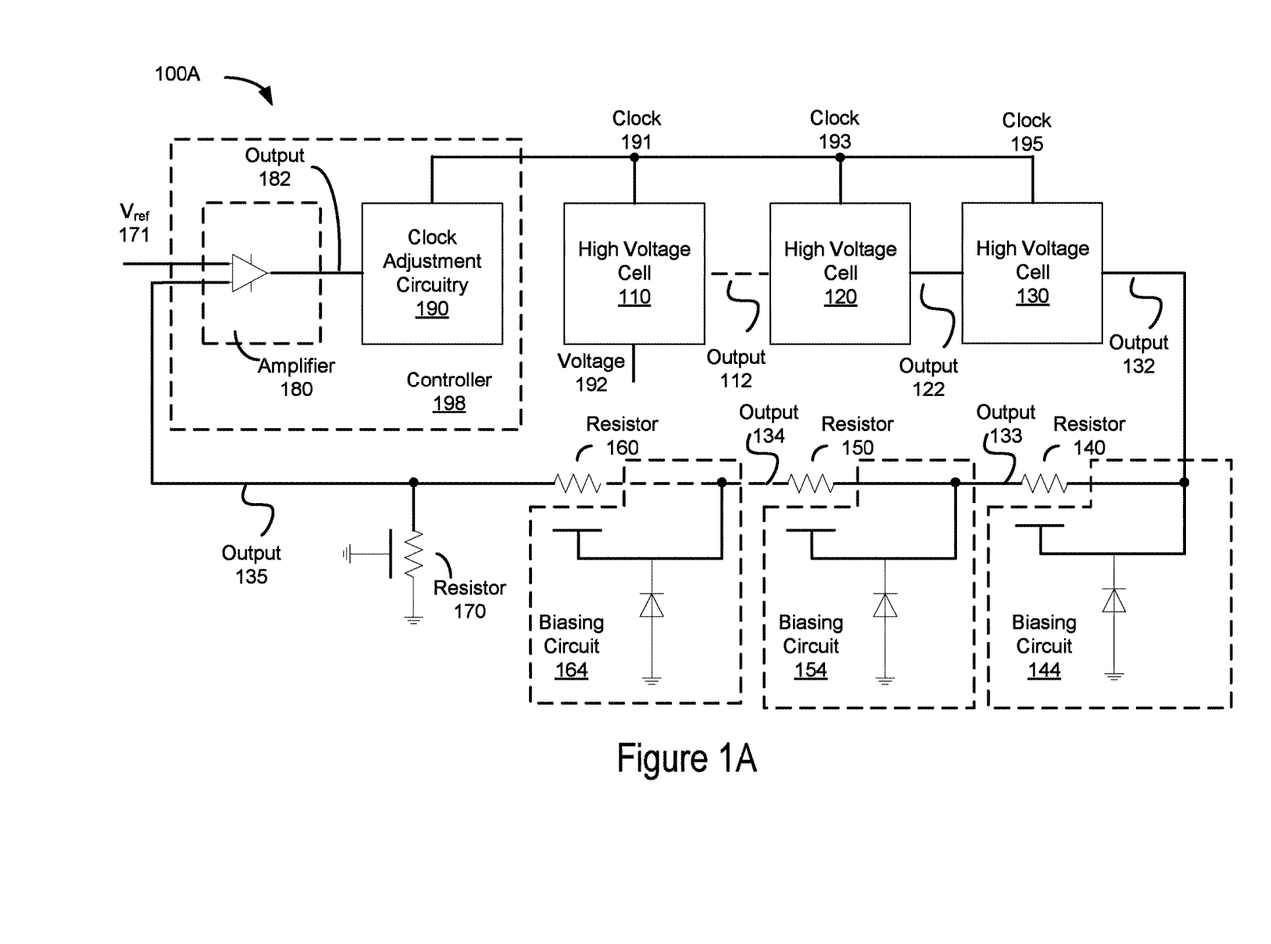
FIGS. 1A-1C show an apparatus with high voltage circuitry with drift mitigation by biasing resistors to outputs of preceding resistors to address voltage stress in accordance with some embodiments.
Figure 1B:
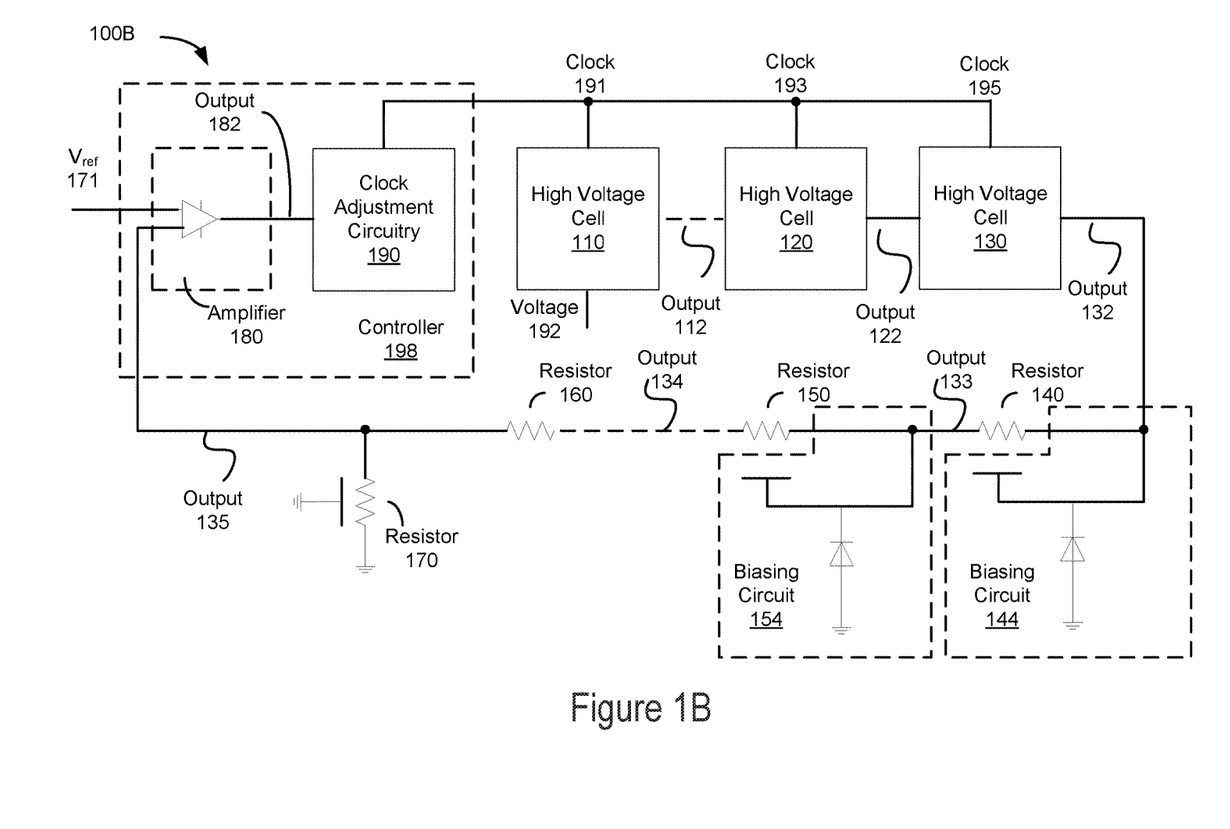

Referring now to FIGS. 1A-1B, an apparatus with high voltage circuitry with drift mitigation by biasing resistors to outputs of preceding resistors to address voltage stress in accordance with some embodiments is shown. Referring specifically to FIG. 1A, apparatus 100A includes a plurality of high voltage cells 110, 120, and 130, coupled to a plurality of resistors 140, 150, and 160, that are coupled to a controller 198. It is appreciated that in some embodiments a controller 198 may include the voltage amplifier 180 and the clock adjustment circuitry 190. It is appreciated that the illustration of the high voltage cells in series and illustration of the resistors in series is for illustrative purposes and should not be construed as limiting the scope of the embodiments. To the contrary, the embodiments may include any configuration, e.g., resistors in parallel, series, or any combination thereof, as well as the high voltage cells in parallel, series, or any combination thereof.

It is appreciated that each high voltage cell may be one or more voltage multiplier. Moreover, each high voltage cell is configured to receive an input voltage and output a voltage that is higher than the input voltage. For example, the high voltage cell 110 may receive a voltage input 192 and outputs a voltage 112 where the output voltage 112 is greater than the input voltage 192. Similarly, the high voltage cell 120 receives the voltage 112 and outputs voltage 122 where voltage 122 is greater than the voltage 112. Similarly, the high voltage cell 130 receives the voltage 122 and outputs a voltage 132 that is higher than the voltage 122. Thus, the output voltage 132 of the plurality of high voltage cells is higher than the input voltage 192. It is appreciated that even though three high voltage cells are illustrated the embodiments should not be construed limited thereto. For example, any number of high voltage cells and in any configuration may be used as long as the output voltage of the last high voltage cell is higher than the input voltage to the first high voltage cell. It is appreciated that the high voltage cell 110 may also be referred to as the first stage high voltage cell and that the high voltage cell 130 may also be referred to as the last stage high voltage cell.

It is appreciated that each high voltage cell may be controlled by the controller 198. For example, in some embodiments, each high voltage cell may be controller by a clocking signal. For example, a clocking signal 191 may be used to control the operation of the high voltage cell 110. Similarly, a clocking signal 193 may be used to control the operation of the high voltage cell 120 and a clocking signal 195 may be used to control the operation of the high voltage cell 130. It is appreciated that the clocking signals 191, 193, and 195 may be the same clocking signal in some embodiments.

It is appreciated that in some embodiments the clocking signal may change the clocking frequency of the high voltage cell. For example, changing the clocking frequency of the clocking signal 191, e.g., increasing the frequency, while maintaining the input voltage 192 constant may cause the output 112 voltage to increase more than in a situation where the frequency is maintained at a constant frequency or when the frequency of the clocking signal is decreased.

In some embodiments, the clocking signal may change the amplitude of the signal, thus the input voltage to the high voltage cell. For example, changing the clocking amplitude of the clocking signal 191, e.g., increasing the amplitude, may result in an increase in the output 112 voltage. It is appreciated that each high voltage cell may be controlled as described above using the clocking signals 191, 193, 195, etc. It is appreciated that in some embodiments, the same clocking signal may control every high voltage cell or a subset of high voltage cells.

In some embodiments, the output 132 voltage is coupled to the plurality of resistors 140, 150, and 160. It is appreciated that the resistors 140, 150, and 160 may be configured in a different fashion, e.g., parallel, series, or any combination thereof, and that the illustration of the resistors in series for illustration purposes only and not intended to limit the scope of the embodiments. The high voltage at output 132, 133, and/or 134, etc., may cause charge trapping and therefore cause the resistance to drift over time resulting in deterioration of the sensitivity and/or the performance. It is appreciated that charge trapping may have a high correlation with voltage across resistor to its substrate or metal above the resistor.

In order to address the charge trapping and the drift, as discussed above, the substrate and metal above the resistor may self-tie to its input or output voltage in order to control the voltage across the resistor and the substrate and/or resistor and the metal to be within a certain acceptable threshold. In other words, the resistor 140 may be self-tied such that the metal layer above the resistor 140 and the substrate below the resistor 140 is biased at a voltage close to the resistor 140 in order to reduce voltage stress. The output 132 voltage from the last stage high voltage cell 130 that is input to the resistor 140 may be self-tied to the resistor 140 through a biasing circuit 144. Similarly, resistor 150 may be self-tied through the biasing circuit 154 similar to the resistor 140. Similarly, resistor 160 may be self-tied through the biasing circuit 164 similar to the resistor 140. It is appreciated that the resistor 140 may be referred to as the first stage resistor that is the first resistor coupled to the last stage high voltage cell 130. It is further appreciated that the resistor 160 may be referred to as the last stage resistor that is coupled to the amplifier 180 and is the last stage resistor in the plurality of resistors that is coupled to the last stage high voltage cell 130. It is appreciated that one or more of the resistors may be a polysilicon resistor.

According to some embodiments, the resistor 170 is used to establish an input voltage to the amplifier 180. The amplifier 180 also receives a reference voltage 171 and compares the output voltage 135 to the reference voltage 171. In response to a difference between the two voltages, the amplifier 180 outputs a signal 182. The signal 182 may be a control signal that is input to the clock adjustment circuitry 190. The clock adjustment circuitry 190 may adjust the clock frequency or amplitude in response to the signal 182 received from the amplifier 180. Based on a difference between the reference voltage and the output voltage 135, the output voltage of one or more high voltage cells, e.g., high voltage cells 110, or 120, or 130 or any combination thereof, may be adjusted to set output voltage 132 at a target value. It is also appreciated that the two or more of the resistors 140-160 may be combined. For example, in some embodiments a biasing may be skipped for every three stages of high voltage cells for each resistor.

It is appreciated that any of the resistors may be biased and biasing of each resistor, as shown in FIG. 1A, is for illustrative purposes and should not be construed as limiting the scope of the embodiments. For example, referring now to FIG. 1B, the apparatus 100B is shown that operates substantially similar to that of FIG. 1A except that the last stage resistor 160 is not biased.

Figure 1C:
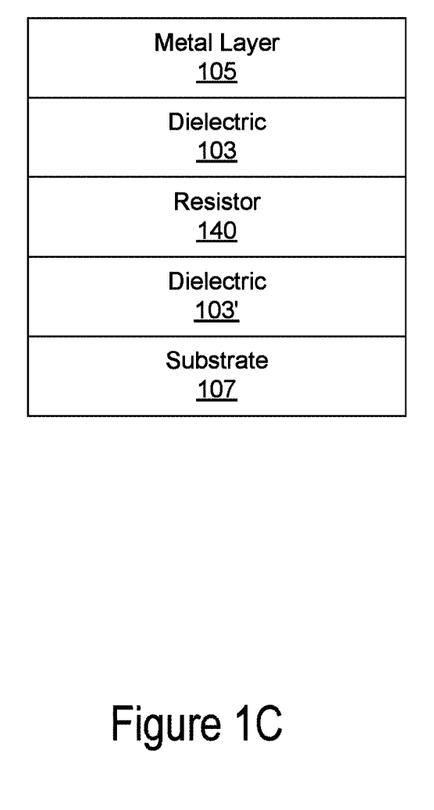

Referring now to FIG. 1C, an illustrative integrated circuit (IC) in accordance with some embodiments is shown. The IC may include a substrate 107, the resistor 140 may be disposed over a dielectric 103' which may be disposed over the substrate 107 and in direct contact with the substrate 107. It is appreciated that the substrate 107 may include a P-well, an N-well, etc. It is appreciated that the resistor 140 may be a polysilicon resistor and that the resistor 140 may be replaced with any of the resistors 150 or 160 or any combination thereof. A dielectric 103 and 103' sandwich the resistor 140. It is appreciated that the metal layer 105 is disposed over the dielectric 103. It is appreciated that the resistor 140 may be self-tied such that the metal layer above the resistor 140 and the substrate below the resistor 140 is biased at a voltage close to the resistor 140 in order to reduce voltage stress. It is appreciated that the dielectric 103' may be disposed between the resistor 140 and the substrate 107.

In some instances, the resistors that are self-tied and biased accordingly may cause leakage through the substrate diodes, thereby changing the resistance and thus causing some inaccuracies. As such, in some embodiments, a different configuration may be used. More specifically referring to FIGS. 2A-2B, an apparatus with high voltage circuitry with drift mitigation by biasing substrates of resistors to outputs of high voltage cells to address voltage stress in accordance with some embodiments is shown. Device 200A is similar to that of 100A as discussed in FIG. 1A, except that instead of self-tying the resistors to bias them, the resistors may be biased to the output of a high voltage cell. For example, the resistor 140 may be biased via the biasing circuit 244 to the output 132 voltage of the high voltage cell 130. Similarly, the resistor 150 may be biased to the output 122 voltage of the high voltage cell 120 via the biasing circuit 254. Similarly, the resistor 160 may be biased to the output 112 voltage of the high voltage cell 110 via the biasing circuit 264. It is appreciated that the biasing circuits 244, 254, and 264 operate substantially similar to the biasing circuits 144, 154, and 164.

Figure 2A:
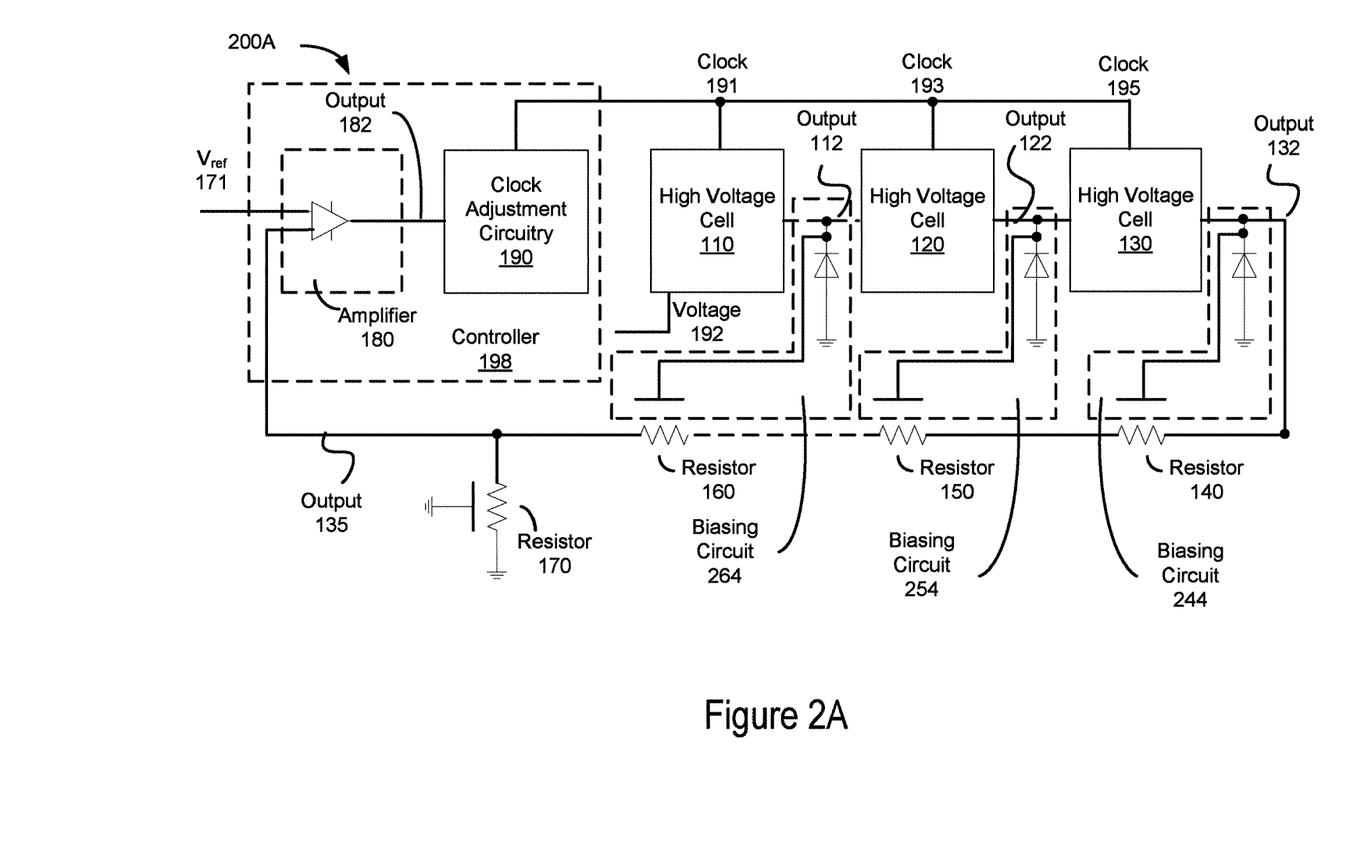
FIGS. 2A-2B show an apparatus with high voltage circuitry with drift mitigation by biasing resistors to outputs of high voltage cells to address voltage stress in accordance with some embodiments.
Figure 2B:
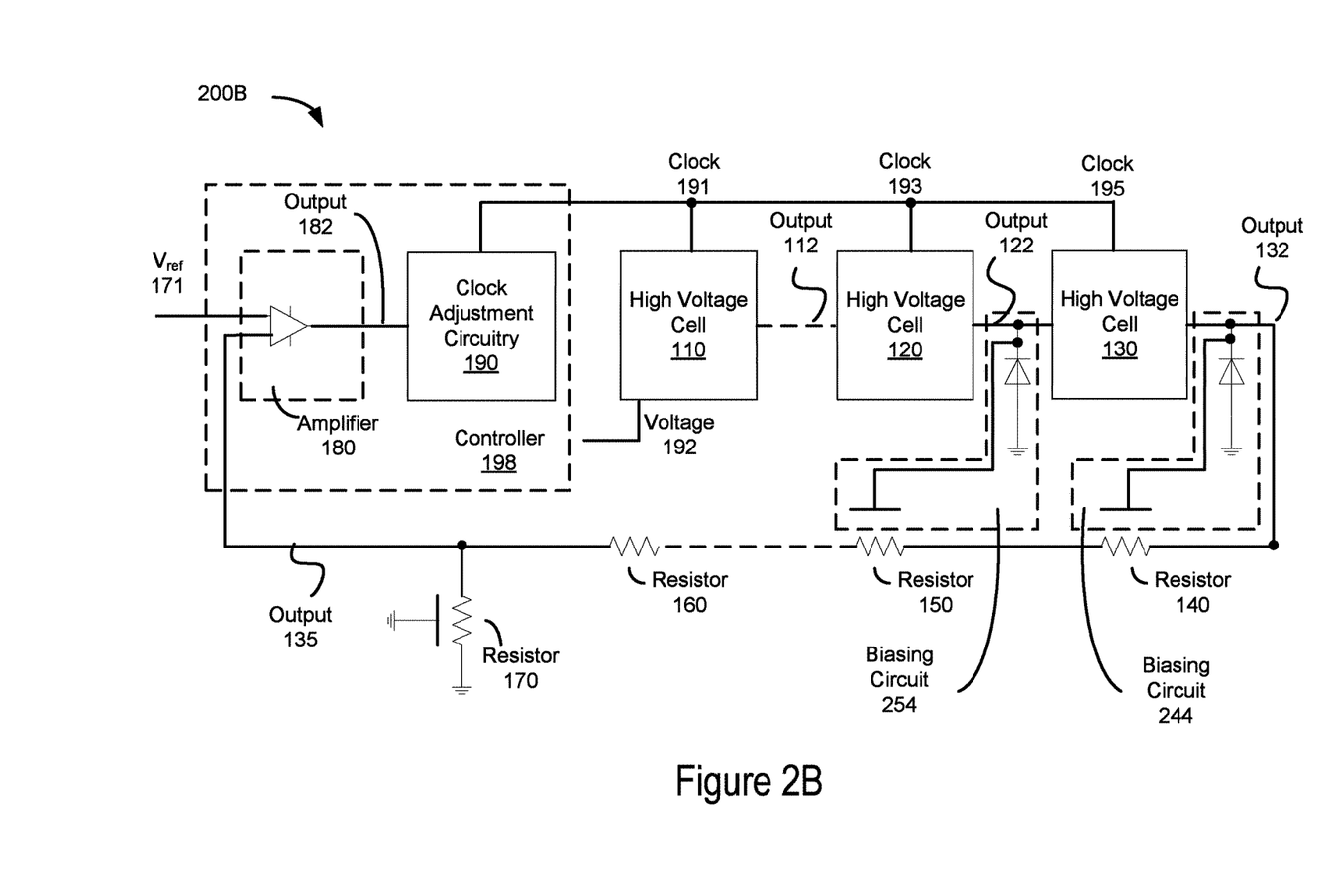

In other words, the substrate below and the metal above each resistor is biased with the voltage output from the high voltage cell that is close to the voltage of the corresponding resistor. In some embodiments, the substrate below and the metal above resistor 140 is biased to the output voltage 132 of the high voltage cell 130 because they are close in voltage. Similarly, the substrate below and the metal above the resistor 150 is biased to the output 122 voltage of the high voltage cell 120 because they are close in voltage. Similarly, the substrate below and the metal above the resistor 160 is biased to the output 112 voltage of the high voltage cell 110 because they are close in voltage.

According to the above discussed configuration and because the high voltage cell is not in the feedback path, any leakage current through the substrate diodes will increase the chain loading in the plurality of high voltage cells without impacting the accuracy of the output of the last stage high voltage cell 130. In other words, any leakage does not significantly impact the accuracy of the output of the last stage high voltage cell 130 because the loop has a high gain. It is appreciated that any of the resistors biased, as shown in FIG. 2A, is for illustrative purposes and should not be construed as limiting the scope of the embodiments. For example, referring now to FIG. 2B, the apparatus 200B is shown that operates substantially similar to that of FIG. 2A except that the last stage resistor 160 is not biased. It is appreciated that in some embodiments, a combination of biasing, as discussed in FIGS. 1A-2B, may be used.

Figure 3:
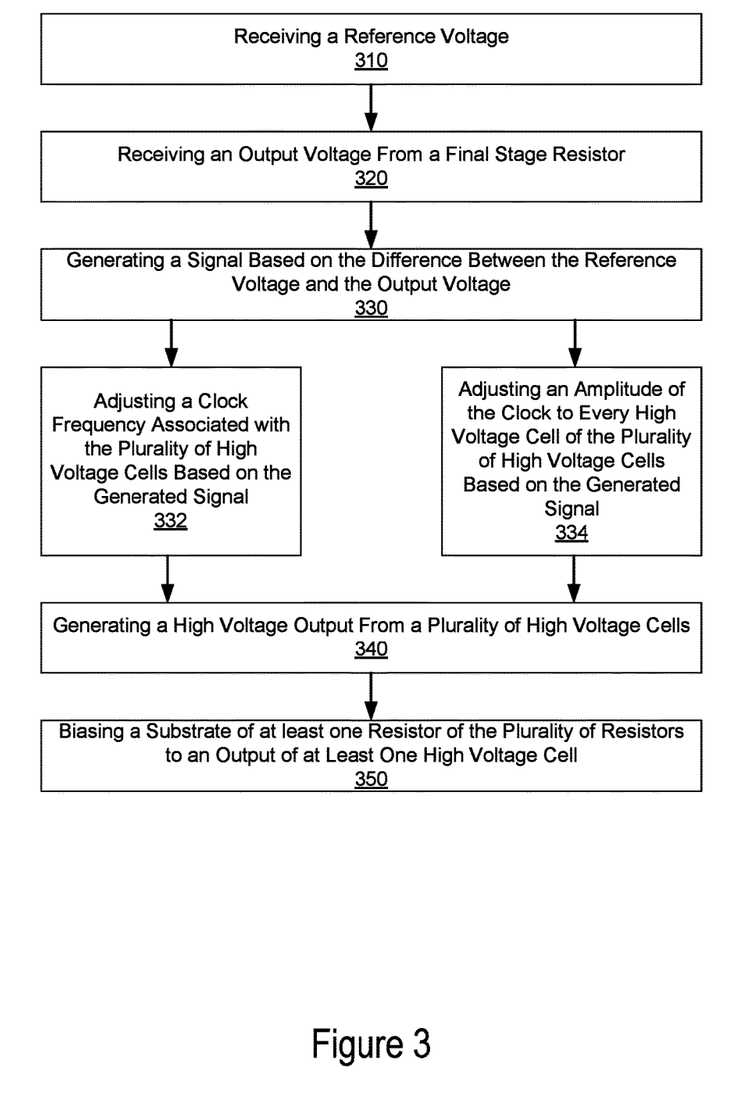
FIG. 3 shows a flow diagram to address voltage stress in accordance with some embodiments.

Referring now to FIG. 3, a flow diagram to address voltage stress in accordance with some embodiments is shown. At step 310, a reference voltage is received. The reference voltage may be similar to the reference voltage received by the amplifier, as described in FIGS. 1A-2B. At step 320, an output voltage from a final stage resistor is received. For example, the voltage from resistor 160 is received. A signal based on the difference between the reference voltage and the output voltage from the final stage resistor is generated, at step 330, e.g., by using an amplifier as described in FIGS. 1A-2B. Optionally, at step 332, a clock frequency associated with the high voltage cells may be adjusted based on the generated signal. For example, the clock frequency for the high voltage cells, e.g., 110-130, may be adjusted based on the signal difference 182. It is appreciated that at step 332, the clock frequency is adjusted while the voltage amplitude of the clocking signal 191 and/or 193 and/or 195 to a high voltage cell, e.g., high voltage cell 110, high voltage cell 120, etc., is maintained. It is appreciated that in some embodiments the input voltage 192 to the first high voltage cell 110 may be maintained. Optionally, at step 334, an amplitude of the clock to every high voltage cell or a subset thereof is adjusted based on the generated signal. For example, the voltage amplitude 191, and/or 193, and/or 195 to a high voltage cell, e.g., high voltage cell 110, high voltage cell 120, etc., may be adjusted based on the signal difference 182. It is appreciated that at step 334, the clock frequency, e.g., clock 191, 193, 195, is maintained constant while the voltage amplitude is being adjusted. At step 340, a high voltage output is generated by the plurality of high voltage cells. At step 350, a substrate of at least one resistor of the plurality of resistors is biased to an output of at least one high voltage cell. For example, the substrate of resistor 140 or 150 or 160 or any combination thereof may be biased to the output of the high voltage cells 130 or 120 or 110 or any combination thereof.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
    a plurality of high voltage cells, wherein the plurality of high voltage cells is configured to generate an output voltage that is higher than an input voltage to the plurality of high voltage cells;
    a plurality of resistors coupled to the plurality of high voltage cells; and
    a controller receiving a reference voltage and an output voltage from a final stage resistor of the plurality of resistors, wherein the controller is configured to generate a signal responsive to a difference between the reference voltage and the output voltage from the final stage resistor, and wherein the controller forms a closed feedback loop with the plurality of high voltage cells and the plurality of resistors, and wherein the generated signal is input to the plurality of high voltage cells,
    wherein a substrate of a resistor of the plurality of resistors is biased to an output of at least one high voltage cell of the plurality of high voltage cells, and wherein an output of the at least one high voltage cell is input to another high voltage cell of the plurality of high voltage cells.

2. The apparatus of claim 1, wherein the resistor of the plurality of resistors that is biased to the output of the at least one high voltage cell of the plurality of high voltage cells is a polysilicon resistor.

3. The apparatus of claim 1, wherein high voltage cells of the plurality of high voltage cells are arranged in series.

4. The apparatus of claim 1, wherein resistors of the plurality of resistors are arranged in series.

5. The apparatus of claim 1, wherein each high voltage cell of the plurality of high voltage cells is configured to generate a high voltage cell output voltage that is higher than its input voltage.

6. The apparatus of claim 1, wherein a substrate of each resistor of the plurality of resistors is biased to an output of a high voltage cell of the plurality of voltage cells associated therewith.

7. The apparatus of claim 1, wherein the controller comprises:
    an error amplifier configured to generate the signal responsive to the difference between the reference voltage and the output voltage from the final stage resistor; and
    a clock adjustment circuitry configured to receive the generated signal from the error amplifier and further configured to adjust a clock frequency associated with the plurality of high voltage cells while maintaining a constant input voltage to a high voltage cell of the plurality of high voltage cells.

8. The apparatus of claim 1, wherein the controller comprises:
    an error amplifier configured to generate the signal responsive to the difference between the reference voltage and the output voltage from the final stage resistor; and
    a clock adjustment circuitry configured to adjust an input voltage to a high voltage cell of the plurality of high voltage cells while maintaining a constant clock frequency for the plurality of high voltage cells.

9. An apparatus comprising:
    a plurality of high voltage cells, wherein the plurality of high voltage cells is configured to generate an output voltage that is higher than an input voltage to the plurality of high voltage cells;
    a plurality of resistors coupled to the plurality of high voltage cells; and
    a controller receiving a reference voltage and an output voltage from a final stage resistor of the plurality of resistors,
    wherein the controller is configured to generate a signal responsive to a difference between the reference voltage and the output voltage from the final stage resistor, and
    wherein the controller forms a closed feedback loop with the plurality of high voltage cells and the plurality of resistors, and
    wherein the controller is configured to generate a control signal based on the generated signal is input to the plurality of high voltage cells,
    wherein an input of at least one resistor of the plurality of resistors bias a substrate of the at least one resistor of the plurality of resistors to an output of at least one high voltage cell of the plurality of high voltage cells, and wherein an output of the at least one high voltage cell is input to another high voltage cell of the plurality of high voltage cells.

10. The apparatus of claim 9, wherein the at least one resistor of the plurality of resistors is a polysilicon resistor.

11. The apparatus of claim 9, wherein high voltage cells of the plurality of high voltage cells are arranged in series.

12. The apparatus of claim 9, wherein each high voltage cell of the plurality of high voltage cells is configured to generate a high voltage cell output voltage that is higher than its input voltage.

13. The apparatus of claim 9, wherein a subset of resistors of the plurality of resistors are arranged in series.

14. The apparatus of claim 13, wherein an output of a resistor within the subset of resistors biases a substrate of a subsequent resistor within the subset of resistors.

15. The apparatus of claim 9, wherein the controller comprises:
    a clock adjustment circuitry configured to receive the control signal and wherein the clock adjustment circuitry is further configured to adjust a clock frequency associated with the plurality of high voltage cells while maintaining a constant input voltage to a high voltage cell of the plurality of high voltage cells.

16. The apparatus of claim 9 further comprising:
    a clock adjustment circuitry configured to adjust an input voltage to a high voltage cell of the plurality of high voltage cells while maintaining a constant clock frequency for the plurality of high voltage cells.

17. A method comprising:
receiving a reference voltage;
receiving an output voltage from a final stage resistor of a plurality of resistors;
generating a signal responsive to a difference between the reference voltage and the output voltage from the final stage resistor;
generating a high voltage output from a plurality of high voltage cells, wherein the high voltage output is based on an input voltage and wherein the high voltage output is further based on the signal, and wherein the high voltage output is higher than the input voltage to the plurality of high voltage cells, and wherein the high voltage output is input voltage to a first stage resistor of the plurality of resistors; and
biasing a substrate of a resistor of the plurality of resistors to an output of at least one high voltage cell of the plurality of voltage cells, and wherein an output of the at least one high voltage cell is input to another high voltage cell of the plurality of high voltage cells.

18. The method of claim 17, wherein an output of the at least one high voltage cell is input to another high voltage cell of the plurality of high voltage cells.

19. The method of claim 17, wherein the resistor of the plurality of resistors that is biased is a polysilicon resistor.

20. The apparatus of claim 17, wherein high voltage cells of the plurality of high voltage cells are arranged in series, and wherein resistors of the plurality of resistors are arranged in series.

21. The method of claim 17 further comprising:
adjusting a clock frequency associated with the plurality of high voltage cells based on the generated signal while maintaining a constant input voltage to a high voltage cell of the plurality of high voltage cells.

22. The method of claim 17 further comprising:
adjusting an input voltage to a high voltage cell of the plurality of high voltage cells based on the generated signal while maintaining a constant clock frequency for the plurality of high voltage cells.

* * * * *